United States Patent [19]

Jouve et al.

[11] Patent Number: 4,525,807
[45] Date of Patent: Jun. 25, 1985

[54] MAGNETIC BUBBLE STORE WITH NON-IMPLANTED MOTIFS AND METHOD FOR CONTROLLING THE SAME

[75] Inventors: Hubert Jouve, Biviers; Joël Magnin, Saint-Martin d'Hères, both of France

[73] Assignee: Commissariat a l'Energie Atomique, Paris, France

[21] Appl. No.: 571,484

[22] Filed: Jan. 17, 1984

[30] Foreign Application Priority Data

Jan. 20, 1983 [FR] France ................. 83 00866

[51] Int. Cl.³ .............................. G11C 19/08
[52] U.S. Cl. .............................. 365/36; 365/8; 365/11; 365/12
[58] Field of Search ............. 365/36, 7, 8, 12, 11

[56] References Cited

U.S. PATENT DOCUMENTS 4,253,159  2/1981  Nelson ................. 365/12
4,281,395  7/1981  Suzuki et al. ........... 365/8
4,387,443  6/1983  Sakamoto et al. ...... 365/19

FOREIGN PATENT DOCUMENTS 2094082  9/1982  United Kingdom .

Primary Examiner—James W. Moffitt

[57] ABSTRACT

A magnetic bubble store, using adjoining non-implanted motifs as bubble-propagating motifs, the store comprising 3n identical, electrically interconnected storage devices, n being a positive integer, which are produced on an identical circuit chip and each comprise minor loops for storing the bubbles, at least one major loop acting as an access loop for the minor loops, first electrical component enabling bubbles to be transferred from the minor loops to the major loop and vice versa, a second electrical component enabling bubbles to be produced on the major loop, and a third electrical component enabling the bubbles on the major loop to be detected, the third, identical component, each formed by an electric conductor for bubble extension and contraction and a magneto-resistive element, being disposed in directions making an angle of 120° with one another.

26 Claims, 10 Drawing Figures

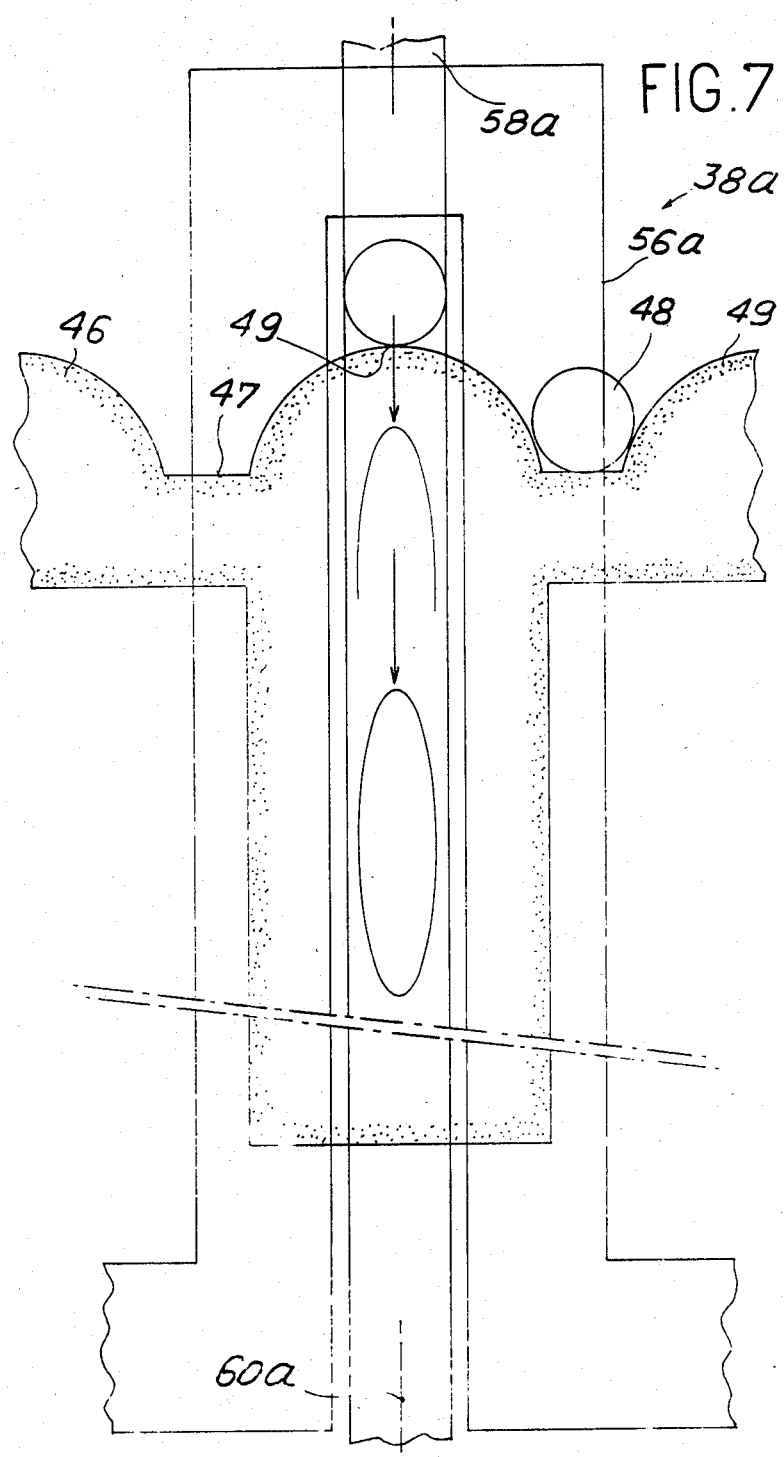

MAGNETIC BUBBLE STORE WITH NON-IMPLANTED MOTIFS AND METHOD FOR CONTROLLING THE SAME

The invention relates to a magnetic bubble store with non-implanted motifs and a method of controlling the same.

The invention relates more particularly to the storage of binary information or bits taking the form of isolated magnetic zones known as bubbles; these generally cylindical zones have a reverse magnetization from that of the rest of the magnetic material (garnet) constituting the layer in which these zones are formed. FIG. 1 shows a portion of a magnetic bubble store. The store comprises a monocrystalline magnetic layer 2, such as a film of magnetic garnet, supported by an amagnetic monocrystalline garnet 4. Zones of magnetic bubbles, as 6, can be produced in the layer 2. The magnetic bubbles can be stabilized by the application of a continuous magnetic field $H_p$ perpendicular to the plane of the magnetic layer 2. In practice the magnetic field is created by a permanent magnet, thus ensuring the non-volatility of the information contained in the store.

In a magnetic bubble store the bubbles 6 are displaced by applying a rotary continuous field $H_T$ in a direction parallel with the surface of the magnetic layer 2. The bubbles are displaced around so-called propagation motifs 8 defined in the upper part 2a of the magnetic layer 2. The motifs 8 take the form of circles, ellipses, lozenges, triangles, polygons, etc. They can be made of iron and nickel based material, or else be obtained by implanting ions in the upper part 2a of the magnetic layer through a mask enabling the shape of the motifs to be defined. In the latter case, since ionic implantation is carried out only around the motifs, they are called non-implanted motifs. The propagation motifs are generally adjacent and have identical shapes and sizes. Due to their shape, for example, lozenges (FIG. 1), two adjacent motifs bound two cavities or hollows 10 between them. The motifs also have apexes or tips 12.

FIG. 2 shows the displacement of the magnetic bubbles 6 under the action of the rotary magnetic field $H_T$. As shown, the displacement of the bubbles along the motifs 8 generally takes place during a time equal to $\frac{1}{3}$ of the period of rotation of the plane magnetic field $H_T$, the bubbles remaining motionless in the cavities 10 defined between two adjacent motifs during the rest of the cycle. The result is shift registers in which the binary information "1" is represented by the presence of a bubble, and the binary information "0" by the absence of a bubble. The displacement made by the magnetic bubbles during a period of rotation of the field is generally called a step; it represents, for example, the distance P separating two apexes 12 of two adjacent motifs 8.

In addition to these propagation motifs, electric conductors must be used in order to carry out the functions of writing, non-destructive reading, register-to-register transfer and deletion in the bubble store. As shown in FIG. 1, the electric conductors, as 14, "traverse" the propagation motifs 8. The conductors 14 are disposed more particularly on a dielectric layer 16 disposed above the layer of material 2.

BACKGROUND OF THE INVENTION

One of the main types of prior art magnetic bubble stores comprises an assembly of loops or registers, known as minor loops, for storing information, this assembly being associated with one or two loops or registers, known as major loops, forming the store access stations. The minor loops are disposed longitudinally, one beside the other, the major loops being orientated perpendicularly to the minor loops. The magnetic bubbles in the minor loops can be transferred to the major loops and vice versa, via the agency of unidirectional or bidirectional transfer gates.

When a single major loop is used, the reading and writing of the information is carried out by means of that single loop. In the first case we speak of a store having a major-minor organization. On the other hand, when two major loops are used, the writing of the information is performed via the agency of one of the two loops, the reading of the information being performed by the agency of the other loop. These major loops are generally situated on either side of the minor loops. In the latter case (two loops), we generally speak of a memory having a series-parallel organization.

In the bubble stores described above, a bubble is produced on a major loop, corresponding to the writing of information, by applying a high current to a generally U-shaped conductor (FIG. 1) passing through the propagation motifs forming the major loop. This operation, generally known as nucleation, is performed when the bubble is in a cavity defined between two adjacent motifs.

After nucleation, the bubble is then propagated by the application of the rotary field $H_T$ on the major loop towards the transfer gates, so as to transfer the bubble from the major loop to a minor loop. The transfer gates generally take the form of a U-shaped conductor. The application of a current pulse to the conductor enables each bubble to be extended between the apexes of the propagation motifs of the major loop and the corresponding ones of the minor loop, whereafter the stoppage of the current pulse produces the contraction of the bubbles on the minor loop. The transfer is then carried out. The information is thus stored on the minor loop.

The reading of the information is performed by transferring a magnetic bubble from a minor loop to a major loop. The transfer is carried out as before.

To perform non-destructive reading of information, the corresponding bubble must be duplicated. In the case of a bubble-for-bubble duplication, such duplication is produced by means of a conductor (FIG. 1) extending through the major loop, to which a current pulse is applied, causing the elongation of the bubble on either side of the propagation paths, and then the cutting of the bubble into two. One of the bubbles, transferred over a detection path, can be destructively detected by a magneto-resistive type detector, generally on an iron and nickel base, and the other bubble will be reinjected into the minor loop at the place occupied by the original bubble.

A bubble store operating on this principle was described in U.S. Pat. No. 4,253,159, filed on Dec. 3, 1979, and entitled "Ion-implanted bubble memory with replicate port". In that patent use is made of a single major loop and non-implanted propagation motifs.

Magnetic bubble stores having non-implanted motifs as propagation motifs and having a structure and operation such as those disclosed hereinbefore (cf. the U.S. Patent) have two important limitations, namely information access time and information flow.

To solve these problems, one approach consists in dividing the bubble store into a number of identical storage devices or elements operating in parallel on the same chip; such independent devices or elements have any organization, for example, a series-parallel or a major-minor organization. The flow of information, which is proportional to the number of storage detectors, is then increased and the information access time diminished, seeing that the storage zone of each device is reduced. Such a storage structure is disclosed in an article by P. K. GEORGE, H. S. GILL, R. H. NORTON, G. F. REYLING, A. M. TUXFORD, which appeared in Intermag Conference Digest, GRENOBLE 1971, Paper No. 9-1.

Although this method enables the performances of the store to be improved (flow, access time), this storage organization or structure requires a number of control circuits proportional to the number of storage devices or elements contained in the chip, and more particularly as regards the multiplicity of the detection circuits of the bubbles; the use of several control circuits considerably increases the manufacturing cost of the store.

PROBLEM OF THE INVENTION

The object of the invention is precisely to provide a magnetic bubble store which uses non-implanted motifs as bubble-propagating motifs while at the same time obviating the aforedescribed disadvantages.

BRIEF DESCRIPTION OF THE INVENTION

More particularly, the invention relates to a bubble store wherein the store comprises 3n identical, electrically interconnected storage devices, n being a positive integer, which are produced on an identical circuit chip and each comprise minor loops for storing the bubbles, at least one major loop acting as an access loop for the minor loops, first electrical means enabling bubbles to be transferred from the minor loops to the major loop and vice versa, a second electrical means enabling bubbles to be produced on the major loop, and a third electrical means enabling the bubbles on the major loop to be detected, the third, identical means, each formed by an electric conductor for bubble extension and contraction and a magneto-resistive element, being disposed in directions making an angle of 120° with one another.

In a variant of the invention the number of storage devices is 6n and the third means are disposed in directions making an angle of 60° with one another.

The result of this assembly and more particularly of the orientation of the bubble-detecting means is a bubble store whose organization is identical to that of bubble stores comprising a single storage device but which comprises, if N is the number of storage devices, N times more minor loops and N times more major loops, and whose information flow is N times greater than those of bubble stores having a single storage device.

For the store to operate correctly, preferably the bubbles which are propagated on the major loops are spaced out by one, two or four steps from one another; one step corresponds to a period of rotation of the rotary field to which the magnetic bubbles are subjected.

These storage devices can also comprise a fourth electrical means enabling the magnetic bubbles to be duplicated, the fourth means being identical and disposed in the same direction.

According to a preferred embodiment of the store according to the invention, the storage devices are three or six in number.

According to another preferred embodiment of the store according to the invention, the second means are electrically interconnected in series.

According to another preferred embodiment of the store according to the invention, the electric conductors for extending and contracting the bubbles and the magneto-resistive elements of the third means are respectively electrically interconnected in series.

The invention also relates to a method of controlling the various electrical means forming the bubble store as defined hereinbefore.

DESCRIPTION OF DRAWING

Other features and advantages of the invention will be gathered from the following examplary description, with reference to the accompanying drawings, wherein:

FIG. 5a in the case of three generators, and FIG. 5b in the case of six generators, FIG. 7 illustrates a method of positioning the bubble detectors at the level of the associated propagating motifs.

DESCRIPTION OF THE PREFERRED EMBODIMENTS

Figure 3:
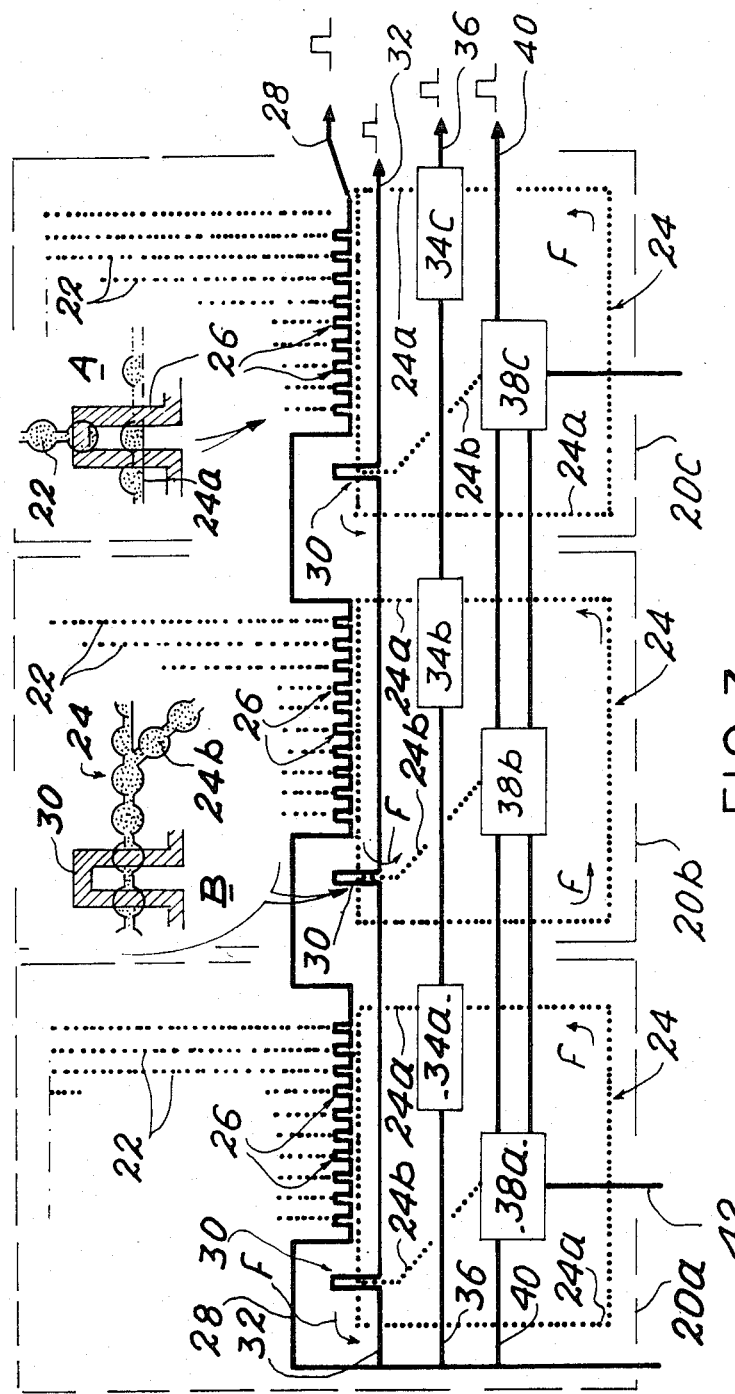
FIG. 3 is a synoptic diagram of the bubble store according to the invention.

FIG. 3 is a synoptic diagram of a bubble store according to the invention. For purposes of simplification, the various elements (conductors, propagation motifs) entering into the constitution of the store are shown in the same plane.

Figure 1:
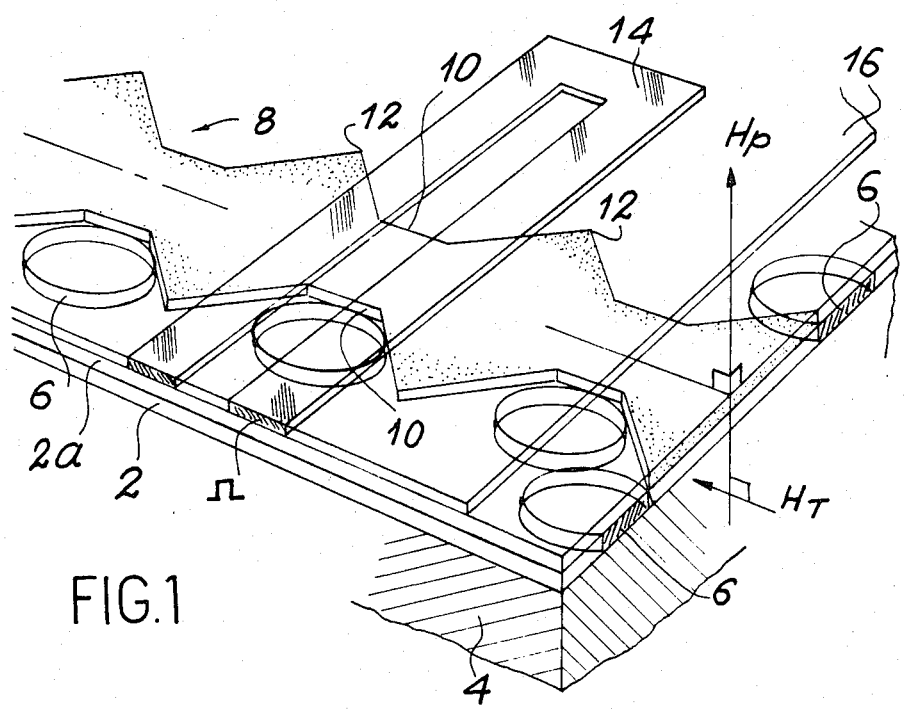
FIG. 1, already described, shows diagrammatically a portion of a bubble store at the level of one of the electric conductors forming the store, FIG. 2, already described, illustrates the principle of propagating bubbles in a bubble store.
Figure 2:
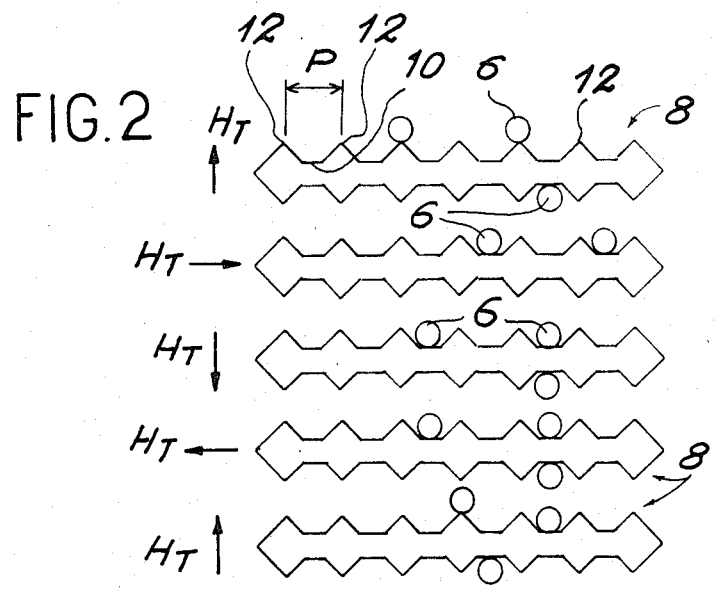

A bubble store comprises 3n or 6n identical storage device, n being a positive integer. Preferably three or six such devices are used (n being equal to 1). The devices 20a, 20b, 20c produced on the same circuit chip can have any organization. For example, as shown in FIG. 1, they have a major-minor organization, but of course any other organization might be considered (more particularly, a series-parallel organization). These different storage devices are electrically interconnected.

Each storage device 20a, 20b or 20c comprises several minor loops 22 used for storing magnetic bubbles (not shown). The minor loops 22 are all disposed one beside the other. More particularly, these three identically constructed devices comprise the same number of minor loops 22 (FIG. 3). Associated with the minor loops 22 for each memory device is a single major loop 24 acting as an access loop for the minor loops 22. The major loop 24, which is orientated perpendicularly to the corresponding minor loops 22, is used both for the writing and reading of information.

The various arrows f shown illustrate the direction of propagation of the magnetic bubbles in the store.

The transfer of the magnetic bubbles from the minor loops 22 to the associated major loop 24 (reading) and vice versa (writing) takes place for each storage device 20a, 20b or 20c via bidirectional transfer gates 26. The transfer gates 26, provided in the same number as the number of minor loops 22, are each formed by a generally U-shaped electric conductor (cf. enlarged part A of the drawing).

According to the invention the transfer gates 26 of the three storage devices 20a, 20b and 20c are electrically interconnected; the various gates are connected via conductor 28. They can be connected in series (FIG. 3) or in parallel. The transfer gates are also identical and disposed in the same direction.

The transfer of the magnetic bubbles via the transfer gates 26 is performed by applying identical currents—i.e., the same current pulse—to such gates. The current impulse is applied simultaneously to all the transfer gates of all the storage devices, so as to perform transfer simultaneously on all such devices. The current pulse can have either a single level of amplitude, or several levels of amplitude of identical or opposite signs.

It should be noted that the electric connection and the control of the transfer gates 26 are identical, whatever the number, 3n or 6n and preferably three or six, of the storage devices forming the store according to the invention maybe.

In addition each storage device 20a, 20b or 20c comprises a conductor 20 enabling the magnetic bubbles to be doubled or duplicated. Such duplication is generally carried out for reading the information contained in the minor loops 22. Information is read by extracting magnetic bubbles from the minor loops 22 via the agency of the transfer gates 26. The bubbles are then sent to the conductor 30 to be duplicated. One of the bubbles obtained by duplication will be sent via propagation path 24a to the minor loop 22 at the place occupied by the original bubble, the other bubble being sent via propagation path 24b to be destructively detected. Each duplication conductor 30 disposed at the level of the corresponding major loop 24 has, for example, the shape of a U (cf. enlarged part B of the drawing).

According to the invention the duplication conductors 30 of the three storage devices 20a, 20b and 20c are electrically interconnected; the connection of the three duplication conductors 30 is performed via conductor 32. The conductors can be connected in series (FIG. 3) or in parallel. They are moreover identical and orientated in the same direction.

The magnetic bubbles are duplicated by means of the conductors 30 by applying identical currents—i.e., the same current pulse to the conductors. The current pulse is applied simultaneously to the three conductors 30 so as to perform simultaneous duplication on the three devices. This current pulse can have either a single level of amplitude or several levels of amplitude of identical or opposite signs.

It should be noted that the electric connection and the control of the duplication conductors 30 are identical, whatever the number, 3n or 6n and preferably three or six, of the storage devices forming the store according to the invention maybe.

Each storage device 20a, 20b or 20c also comprises a magnetic bubble generator 34a, 34b or 34c more particularly operating on the nucleation principle. Each generator or nucleator disposed at the level of the corresponding major loop 24 is formed by an electric conductor, to which electric pulses produced in the formation of bubbles can be applied.

According to the invention the generators 34a, 34b and 34c of the three storage devices 20a, 20b and 20c respectively are electrically interconnected, preferably in series, the three generators being connected via conductor 36.

The organization and control of these generators will be disclosed in a more detailed manner hereinafter with reference to FIGS. 4, 5a and 5b.

Each storage device 20a, 20b or 20c also comprises a magnetic bubble detector 38a, 38b or 38c operating on the principle of destructive detection. Each detector, disposed at the level of the corresponding major loop 24, is formed more particularly by an electric conductor, known as an extension-contraction conductor, and a preferably magneto-resistive conductive element based on iron and nickel. When a continuous current flows through such conductor, the application of current pulses to the corresponding extension-contraction conductor results in the detection of the bubbles.

According to the invention the detectors 38a, 38b and 38c of the three storage devices 20a, 20b and 20c respectively are electrically interconnected, preferable in series; the extension-contraction conductors are connected via conductor 40, and the magneto-resistive conductive elements via conductor 42.

The organization and control of these detectors will be disclosed in greater detail hereinafter with reference to FIGS. 6, 7, 8a and 8b.

Such a storage organization, of course applicable to a store comprising six identical storage devices, enables the information flow to be increased. Moreover, the store requires for its operation the same number of electric conductors such as the conductors 28, 32, 36, 40 and 42, as necessitated by a bubble store formed by a single storage device.

To enable the bubble store disclosed hereinbefore to operate correctly, preferably the bubbles which are propagated on the major loops are spaced out from one another by 1, 2 or 4 steps, a magnetic bubble making a step during a period of rotation of the rotary magnetic field $H_T$.

Figure 4:
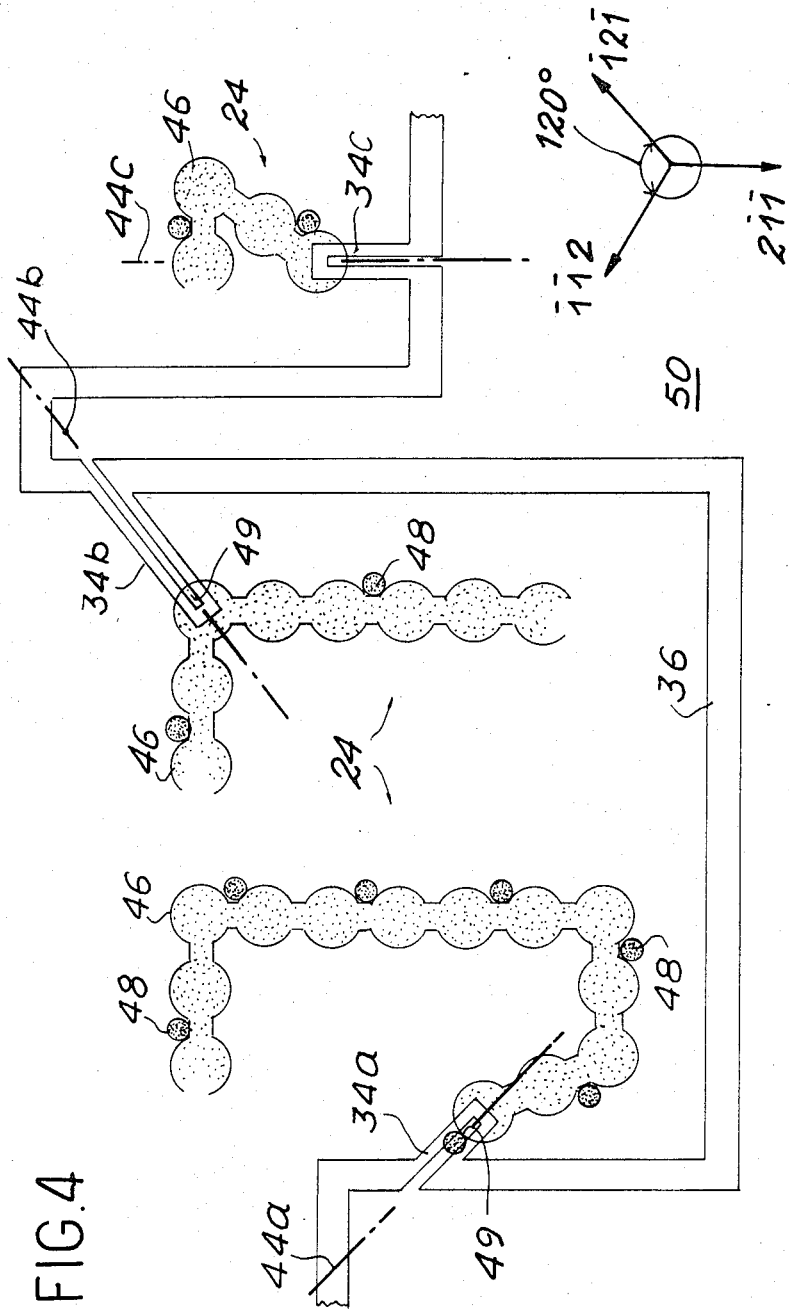
FIG. 4 illustrates the connection and arrangement of the different bubble generators of the store according to the invention.
Figure 5A:
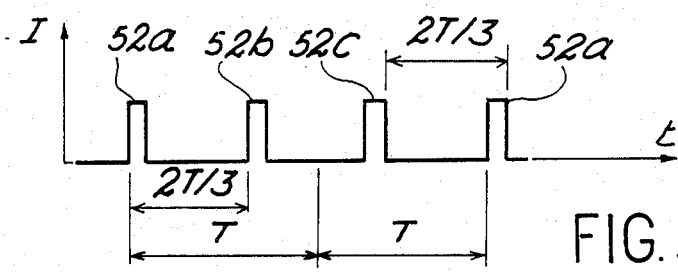
FIGS. 5a and 5b show the control signals relating to the bubble generators.
Figure 5B:
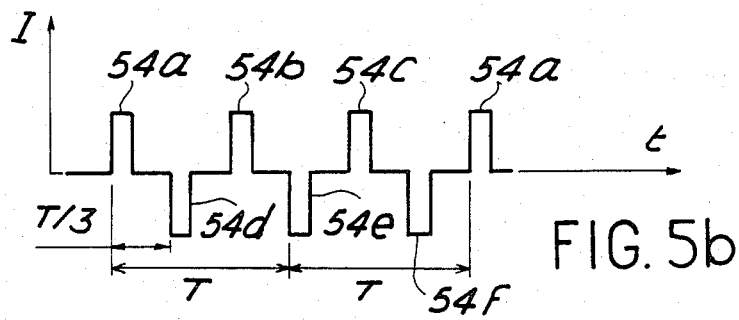

FIG. 4 shows the organization of the magnetic bubble generators in the case of three generators—i.e., a bubble store comprising three storage devices 20a, 20b and 20c (FIG. 3). The generators 34a, 34b and 34c are formed by electric conductors which can each have an axis of symmetry 44a, 44b and 44c respectively. The more particularly U-shaped conductors are electrically interconnected, preferably in series, via conductor 36.

FIG. 4 also shows the adjacent non-implanted propagation motifs 46 of the corresponding major loops 24 (FIG. 3) disposed at the level of each generator. These motifs 46, around which the displacement of magnetic bubbles 48 subjected to a plane, continuous rotary magnetic field $H_T$ is performed, defined by ion-implantation in the upper part of the layer of monocrystalline magnetic material 50 containing the bubbles. With a view to simplification, the different elements of the store (conductors, propagation motifs) and also the bubbles are shown in the same plane.

As shown in FIG. 4, the generation of the magnetic bubbles 48 is distinguished on each storage device 20a, 20b, or 20c by the orientation of the generators 34a, 34b and 34c. The generation of the magnetic bubbles by means of the generators can be performed only if there is a relation between the phase of the electric pulse applied to the generators and the orientation of the generators; the pulse phase is the phase of the magnetic field $H_T$ at the moment when such pulse is applied. This is done by using generators whose phase margin or tolerance is narrow. The phase margin is ±20°.

Normally the magnetic bubbles are formed in the cavities or hollows (FIG. 1) defined between two adjacent propagation motifs. According to the invention this kind of bubble formation cannot be used, since the phase margin of the corresponding generators is much too large (±80°).

According to the invention the three generators 34a, 34b and 34c are identical and orientated in directions making angles of 120° with one another. In other words, when the generators have axes of symmetry 44a, 44b and 44c respectively, the three axes make an angle of 120° with one another. The axes of symmetry can, for example, be directed along the three equivalent, coplanar, easily magnetized crystallographic axes of the layer of magnetic material 50, forming an angle of 120° with one another. For a layer of material 50 epitaxiated on a substrate in the direction 111, the three crystallographic axes are more particularly the axes 112, 121 and 211, as shown at the bottom right-hand side of the figure.

The formation of magnetic bubbles by means of the generators 34a, 34b and 34c is performed by applying the same electric signal to the three electric conductors forming the generators. The signal comprises several current pulses having, for example, a single level of amplitude, and enabling the three generators to be controlled successively. As shown in FIG. 5a, which illustrates the amplitude of the current pulses I as a function of time t, the pulses have the same polarity and are spaced out from one another by a time equal to q/3 period of rotation T of the rotary magnetic field $H_T$, q being the number of steps separating the magnetic bubbles 48 from one another on the major loops 24; more particularly, when the bubbles are spaced out by two steps (q=2), the current pulses are spaced out by a time equal to ⅔ of the period of rotation of the field $H_T$. The pulses 52a, 52b and 52c are applied respectively to the electric conductors forming the three magnetic bubble generators 34a, 34b and 34c.

Moreover, (FIG. 4), the formation of the magnetic bubbles by means of the three generators is preferably performed from the apexes 49 of the propagation motifs 46 associated with each generator.

In the case of six generators—i.e., a bubble store comprising six identical storage device—the six identical generators are regrouped in two groups of three generators, the two groups being electrically connected in series. According to the invention, the generators of the same group are connected and orientated as shown in FIG. 4—i.e., in such a way that the three axes of symmetry of the electric conductors forming the generators make an angle of 120° with one another. These axes of symmetry can more particularly be directed along the equivalent, easily magnetizable coplanar crystallographic axes (112, 121, 211) of the layer of material containing the magnetic bubbles.

The formation of the magnetic bubbles, or nucleation, by means of six generators is performed by applying the same electric signal to the six electric conductors forming the generators. The signal comprises several current pulses, having a single level of emplitude and enabling the six generators to be controlled successively. As shown in FIG. 5b, which illustrates the amplitude of the current pulses I as a function of time t, the current pulses are spaced out from one another by a time equal to q/6 period of rotation t of the rotary magnetic field $H_T$, q being the number of steps separating the magnetic bubbles from one another on the major loops 24; more particularly, when the bubbles are spaced out by two steps, the pulses are spaced out by a time equal to ⅓ of the period of rotation of the field $H_T$.

Moreover, the two groups of generators are controlled alternately and the current pulses, applied to the three generators of the same group, are of opposite polarity from those applied to the three generators of the other group; the pulses 54a, 54b, 54c of identical polarity, are applied respectively to the three magnetic bubble generators, for example, 34a, 34b and 34c (FIG. 4) belonging to the same group, the pulses 54d, 54e, 54f, of opposite polarity from that of the pulses 54a, 54b and 54c being applied respectively to the three generators of the other group.

As before, the magnetic bubbles are preferably formed from apexes 49 of the propagation motifs 46 associated with each generator (FIG. 4).

Figure 6:
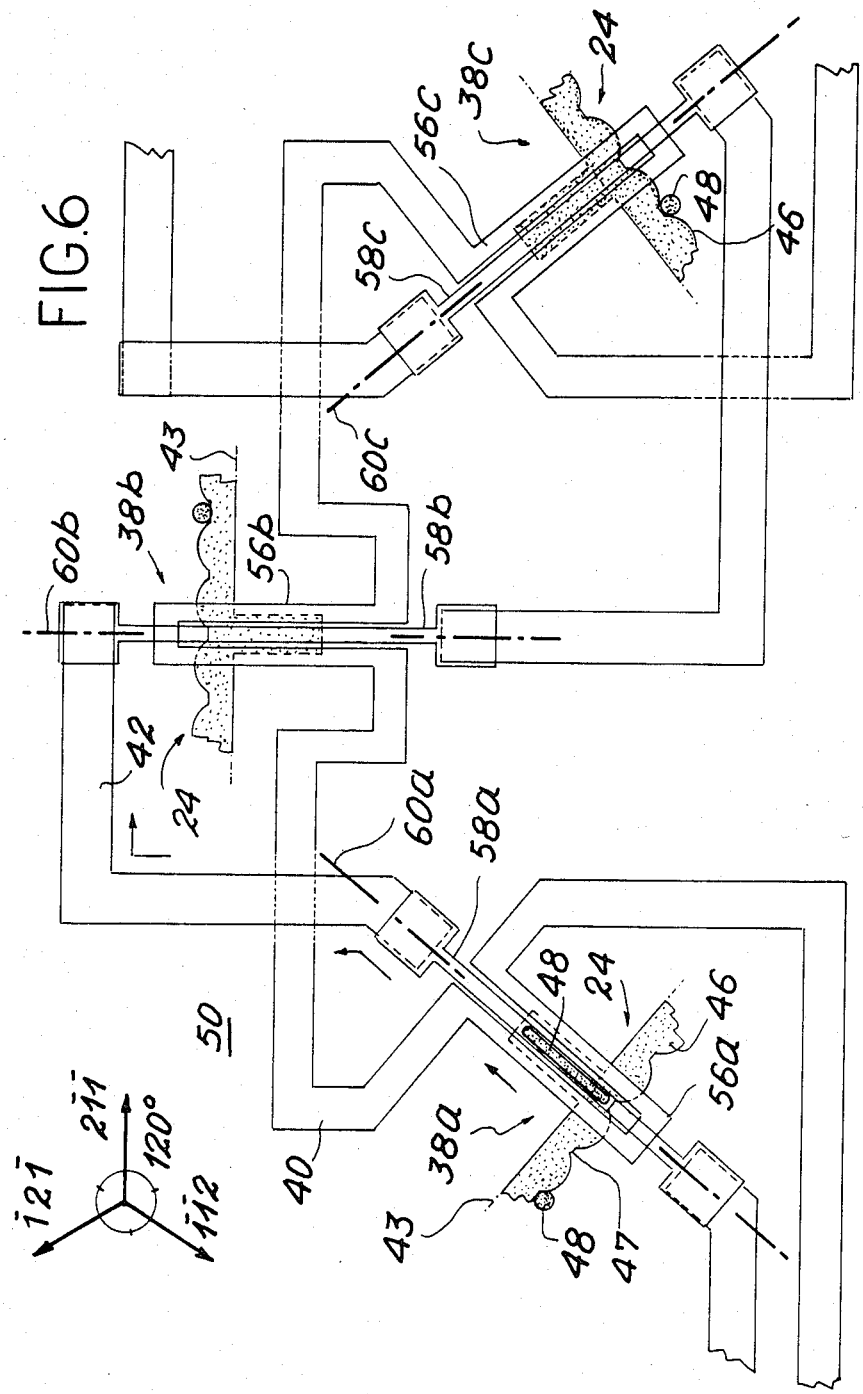
FIG. 6 illustrates and connection and arrangement of the different bubble detectors of the store according to the invention.

FIG. 6 shows the organization of the magnetic bubble detectors in the case of three detectors—i.e., a bubble store comprising three storage devices 20a, 20b and 20c (FIG. 3). The detectors 38a, 38b and 38c are each formed by a more particularly U-shaped extension-contraction electric conductor 56a, 56b and 56c respectively, and by a magneto-resistive type conductive element 58a, 58b and 58c. The extension-contraction conductors are electrically interconnected, preferably in series, by means of conductor 40 and the magneto-resistive elements are electrically interconnected, preferably in series, by means of conductor 42. The detectors 38a, 38b and 38c can each have an axis of symmetry 60a, 60b and 60c respectively. These axes correspond at one and the same time to the axes of symmetry of the extension-contraction conductors and to the axes of symmetry of the magneto-resistive elements.

FIG. 6 also shows the non-implanted propagation motifs 46 of the corresponding major loops 24 (FIG. 3) disposed at the level of each detector, and also the magnetic bubbles 48 which move along such motifs.

As with the magnetic bubble generators (FIG. 4), the detectors 38a, 38b and 38c are distinguished from one another by their orientation on the corresponding storage devices. According to the invention the three detectors 38a, 38b and 38c are identical and orientated in directions making angles of 120° with one another. In other words, when the detectors have axes of symmetry 60a, 60b and 60c respectively, the three axes form an angle of 120° with one another.

It will be recalled that the destructive detection of a magnetic bubble consists in first elongating the bubble, by energizing the extension-contraction conductor and then detecting the bubble by means of the magneto-resistive element, through which a constant current flows, and in contracting the bubble, by energizing the extension-contraction conductor. The detection of a magnetic bubble by the magneto-resistive element corresponds to the conversion of the bubble into an electric signal. After the contraction of the bubble, it can be destroyed or else returned to the minor loops.

To avoid the fomration of magnetic bubbles (nucleation) during the bubble-extension phase, the propagation motifs 46 disposed opposite each detector 38a, 38b or 38c can be aligned along an axis 46 parallel with one of the equivalent, easily magnetizable complanar crystallographic axes of the layer of material 50 containing the propagation motifs 46. As shown in FIG. 6, the three crystallographic axes can be, for example, the axes 112, 121 and 211 for a layer of material 50 epitaxiated in a direction 111.

As the axis of alignment 43 of the propagation motifs generally lies in a direction perpendicular to the axis of symmetry 60, 60b or 60c of the corresponding detector, it follows that these axes of symmetry are orientated perpendicularly to such easily magnetizable coplanar crystallographic axes. In such an arrangement, the magnetic bubbles 48 are extended from one of the cavities 47 bounded between two adjacent motifs 46 (FIG. 6). More particularly, the axis of symmetry 60a, 60b or 60c of the detectors associated with these propagation motifs passes through the two cavities bounded by two corresponding adjacent motifs.

Another method (FIG. 7) is to extend the magnetic bubbles 48 from one of the apexes 49 of the propagation motifs 46 associated with each detector. In that case the orientation of the propagation motifs in relation to the easily magnetizable crystallographic axes of the layer of material containing the propagation motifs is of little importance.

The detection of the magnetic bubbles by means of the three detectors 38a, 38b and 38c is performed by applying the same electric signal to the three extension-contraction conductors forming them, the magneto-resistive elements being supplied with continuous current. The signal comprises several current pulses, enabling the three extension-contraction conductors to be energized successively. The actual detection of the bubbles by means of the three magneto-resistive elements is also performed successively by such elements.

The control of a detector consists more particularly in applying to the extension-contraction conductor forming it two current pulses having, for example, the same amplitude, but reverse polarities. They can have different or identical durations. FIG. 8 shows the amplitude of current pulses I as a function of time t.

The current pulses 62a, 62b and 62c of identical polarity applied to the three extension-contraction conductors 56a, 56b and 56c respectively enable the magnetic bubbles 48 to be detected to be elongated over a length of about 100μ in the spaces provided for the purpose. Similarly, the pulses 64a, 64b and 64c of reverse polarity from that of the pulses 62a, 62b and 62c, applied to the three extension-contraction conductors 56a, 56b and 56c respectively enable the previously elongated magnetic bubbles 48 to be contracted.

Figure 8A:
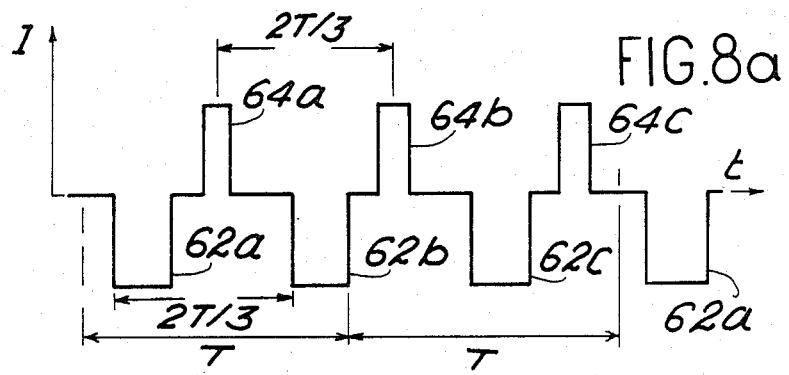
FIGS. 8a and 8b illustrate the control signals relating to the bubble detectors, FIG. 8a in the case of three detectors and FIG. 8b in the case of six detectors.

As shown in FIG. 8a, the current pulses 62a, 62b and 62c for bubble extension respectively energizing the three extension-contraction conductors are spaced out from one another by a time equal to q/3 period of rotation T of the rotary magnetic field $H_T$, q being the number of steps separating the magnetic bubbles 48 from one another on the major loops 24; for example, when the bubbles are spaced out by two steps (q=2), the pulses are spaced out by a time equal to ⅔ of the period of rotation of the field $H_T$.

Similarly, the current pulses 64a, 64b and 64c for contracting the bubbles which energize the three extension-contraction conductors are spaced out from one another by a time equal to q/3 period of rotation T of the rotary magnetic field $H_T$, q being the number of steps separating the magnetic bubbles 48 from one another on the major loops 24. Any time can separate the pulses for bubble elongation and those for bubble contraction.

As regards actual detection by means of the magneto-resistive elements, this is done by applying a continuous current to the three serially connected elements. The presence of a bubble in one of the detectors causes a variation in the resistance of the magneto-resistive element. The resulting electric signal appears only in a portion of the cycle of rotation of the rotary field $H_T$. This detection is performed successively on the three magneto-resistive elements. The detection signals relating to the three elements 58a, 58b and 58c are spaced out from one another by a time equal to q/3 period of rotation T of the rotary field $H_T$. The use of magneto-resistive elements on an iron and nickel base facilitates the detection of the magnetic bubbles, since these elements have a good signal-to-noise ratio and a low impedance; this particularly facilitates their connection in series (FIG. 6).

In the case of six detectors—i.e., a bubble store comprising six identical storage devices—the six identical detectors are regrouped in two groups of three detectors, the two groups being electrically connected in series; in other words, the two groups of extension-contraction conductors on the one hand, and the two groups of magneto-resistive elements on the other are connected in series.

According to the invention the detectors of the same group are connected and orientated as shown in FIG. 6—i.e., so that the three axes of symmetry of the detectors form an angle of 120° with one another. Moreover, the two groups of detectors are orientated in relation to one another in such a way that the six axes of symmetry make an angle of 60° with one another.

The six axes of symmetry can, for example, be directed perpendicularly to the three equivalent, easily magnetizable coplanar crystallographic axes of the layer of material 50 containing the propagation motifs; in other words, the axes of alignment of the propagation motifs disposed opposite each detector can be orientated in parallel with the crystallographic axes, the axes of alignment being perpendicular to the axes of symmetry of corresponding detectors. The crystallographic axes can be more particularly the axes 112, 121 and 211 for a layer of material expitaxiated in a direction 111. In such an arrangement of the detectors the magnetic bubbles are extended, as in the case of three detectors, from one of the cavities bounded between two adjacent motifs (FIG. 6).

As previously, the magnetic bubbles can also be extended to one of the apexes of the propagation motifs associated with each detector (FIG. 7) to avoid the problem of nucleation, whatever the orientation of the motifs in relation to the crystallographic axes may be.

The detection of the magnetic bubbles by means of the six detectors is performed as previously, by applying the same electric signal to the six extension-contraction conductors forming the detectors, the magneto-resistive elements being supplied with continuous current. This signal comprises several pulses, enabling the six extension-contraction conductors to be energized successively. The actual detection of the bubbles by means of the six magneto-resistive elements is also performed successively by such elements.

Figure 8B:
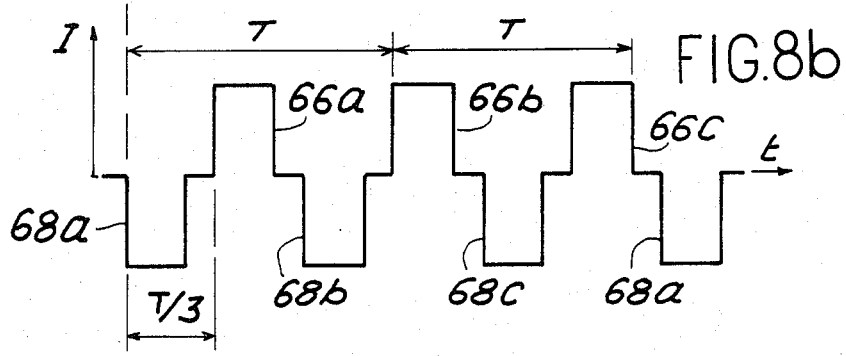

The control of a detector consists in applying to the extension-contraction conductor performing it two current pulses more particularly having the same amplitude, but different polarities. As shown in FIG. 8b, which illustrates the amplitude of the current pulses I as a function t, the pulses 66a, 66b and 66c of identical polarity, are applied respectively to the extension-contraction conductors, for example, 56a, 56b and 56c (FIG. 6) belonging to the same group of detectors, to allow the elongation of the magnetic bubbles 48 to be detected by means of such detectors. These same pulses are applied respectively to the extension-contraction conductors belonging to the other group of detectors, to enable other magnetic bubbles to be contracted.

Similarly, impulses 68a, 68b and 68c, of opposite polarity from that of the pulses 66a, 66b and 66c are applied respectively to the extension-contraction conductors, for example, 56a, 56b and 56c (FIG. 6) belonging to the same group of detectors, to enable the previously elongated magnetic bubbles 48 to be contracted. These same impulses are applied respectively to the extension-contraction conductors belonging to the other group of detectors, to enable other magnetic bubbles to be elongated.

It should be noted that the detectors must be so designed that the amplitude and duration of the elongation of the magnetic bubbles are equal to the amplitude and duration respectively of the contraction of the same bubbles. It follows that the current pulses for elongating the bubbles, and the current pulses for contracting them, must have the same amplitude and the same duration as shown in FIG. 8b. According to the invention the current pulses for extending the bubbles, energizing respectively the three extension-contraction conductors of the same group of detectors, are spaced out from one another by a time equal to q/3 period of rotation T of the rotary magnetic field $H_T$, when the magnetic bubbles 48 are spaced out from one another by q steps on the major loops 24. The same thing applies to the current pulses for bubble contraction, energizing respectively the three extension-contraction conductors of the same group. Consequently, all the current pulses 66a, 68a, 66b, 68b, 66c, 68c successively applied to the three extension-contraction conductors of the same group are spaced out by a time equal to q/6 period of rotation of the rotary field—i.e., the bubble-extending pulses for the six detectors, and the bubble-contracting pulses for the six detectors are spaced out from one another by q/6 period of rotation of the field $H_T$.

The actual detection, using the magneto-resistive elements, is performed as before—i.e., successively on the six elements. The detection signals relating to the three elements of the same group are spaced out from one another by a time equal to q/3 period of rotation of the field—i.e., the detection signals relating to the six elements are spaced out from one another by a time equal to q/6 period of rotation of such field.

The magnetic bubbles stored with non-impanted motifs and its control method, as disclosed hereinbefore, enable the information flow contained in the store to be appreciably increased in comparison with the prior art bubble stores.

We claim:

1. A magnetic bubble store, using adjoining non-implanted motifs as bubble-propagating motifs, wherein the store comprises 3n identical, electrically interconnected storage devices, n being a positive integer, which are produced on an identical circuit chip and each comprise minor loops for storing the bubbles, at least one major loop acting as an access loop for the minor loops, first electrical means enabling bubbles to be transferred from the minor loops to the major loop and vice versa, a second electrical means enabling bubbles to be produced on the major loop, and a third electrical means enabling the bubbles on the major loop to be detected, the third, identical means, each formed by an electric conductor for bubble extension and contraction and a magneto-resistive element, being disposed in directions making an angle of 120° with one another.

2. A magnetic bubble store, using adjoining non-impanted motifs as bubble-propagating motifs, wherein the store comprises 6n identical, electrically interconnected storage devices, n being a positive integer, which are produced on an identical circuit chip and each comprise minor loops for storing the bubbles, at least one major loop acting as an access loop for the minor loops, first electrical means enabling bubbles to be transferred from the minor loops to the major loop and vice versa, a second electrical means enabling bubbles to be produced on the major loop and a third electrical means enabling the bubbles on the major loop to be detected, the third, identical means, each formed by an electric conductor for bubble extension and contraction and a magneto-resistive element, being disposed in directions making an angle of 60° with one another.

3. A bubble store according to claims 1 or 2, wherein the bubbles which are propagated on the major loops are spaced out from one another by one, two or four steps.

4. A bubble store according to claims 1 or 2 wherein the first means are identical and disposed in the same direction.

5. A bubble store according to claims 1 or 2 wherein each storage device also comprises a fourth electrical means, enabling the magnetic bubbles to be duplicated, such fourth means being identical and disposed in the same direction.

6. A bubble store according to claims 1 or 2 wherein the second means are electrically interconnected in series.

7. A bubble store according to claims 1 or 2 wherein the electric conductors for the extension and contraction of the bubbles of the third means are respectively electrically interconnected in series.

8. A bubble store according to claims 1 or 2 wherein the magneto-resistive elements of the third means are respectively electrically interconnected in series.

9. A bubble store according to claim 1 wherein the storage devices are three in number.

10. A bubble store according to claim 9, wherein the second means each formed by an electric conductor are identical and disposed in directions making an angle of 120° with one another.

11. A bubble store according to claim 2 wherein the storage devices are six in number.

12. A bubble store according to claim 11 wherein the second means, each formed by an electric conductor, are identical and regrouped in two groups of three and so orientated that the second means of the same group make an angle of 120° with one another.

13. A bubble store according to claim 11 wherein the third means are regrouped in two groups of three, and so disposed that the six third means make an angle of 60° with one another, the third means of the same group forming an angle of 120° with one another.

14. A bubble store according to claims 10 or 12 wherein associated with each second means are propagation motifs made in a layer of monocrystalline magnetic material having three coplanar crystallographic axes of easy magnetization which form an angle of 120° with one another, and each second means is directed in one of the crystallographic axes.

15. A method of controlling the first electrical means of a bubble store according to claim 4, wherein the same current impulses applied simultaneously to all the first means, in order to transfer simultaneously on the various storage devices minor loops to the corresponding major loop, and vice versa, on the different storage devices of the magnetic bubbles.

16. A method of controlling the fourth electrical means of a bubble store according to claim 5, wherein the same current pulse is applied simultaneously to all the fourth means, in order to duplicate magnetic bubbles simultaneously on the different storage devices.

17. A method of controlling the second means of a bubble store according to claim 10, wherein a current pulse is applied successively to the second means, the three current pulses being spaced out from one another by a turn equal to q/3 period of rotation of the rotary magnetic field, enabling the bubbles to be propagated along the non-implanted motifs, q being the number of steps separating the bubbles from one another on the major loops.

18. A method according to claim 17 wherein the three current pulses have the same polarity.

19. A process for controlling the second means of a bubble store according to claim 12, wherein a current pulse is applied successively to the second means, the six current pulses being spaced out from one another by a time equal to q/6 period of rotation of the rotary magnetic field, enabling non-implanted bubbles to be propagated, q being the number of steps separating the bubbles from one another on the major loops.

20. A method according to claim 19 wherein the two groups of second means are controlled alternately, the current pulses associated with one of such groups being of reverse polarity from those associated with the other group.

21. A method according to claim 17 wherein propagation motifs having two apexes are associated with each second means, the bubbles being produced from such apexes.

22. A process for controlling the third means of a bubble store according to claim 9, wherein the detection of the bubbles by the third means comprises a bubble-elongating phase and a bubble-contracting phase, and the third means are controlled successively by applying to the extension-contraction electric conductor forming each third means two current pulses of reverse polarity, one for the elongation and the other for the contraction of the bubbles, the current pulses for such elongation and the current pulses for such contraction being respectively spaced out from one another by a time equal to q/3 period of rotation of the rotary magnetic field, enabling bubbles to be propagated along the non-implanted motifs, q being the number of steps separating the bubbles from one another on the major loops.

23. A method of controlling the third means of a bubble store according to claim 13, wherein the detection of the bubbles by the third means comprises a bubble-elongating phase and a bubble-contracting phase, and the third means of each group are controlled successively by applying to the extension-contraction electric conductor forming each third means two current impulses of reverse polarity, one for the elongation and the other for the contraction of the bubbles, all the current pulses applied to each group being spaced out from one another by a time equal to q/6 period of rotation of the rotary magnetic field, enabling bubbles to be propagated along the non-implanted motifs, q being the number of steps separating the bubbles from one another on the major loops, the two groups of third means being controlled simultaneously, each impulse elongating the bubbles at the level of one of the third means of a group and contracting other bubbles at the level of one of the third means of the other group.

24. A method according to claim 23, wherein the impulses all have the same amplitude and duration.

25. A method according to claims 22 or 23 wherein associated with each third means are propagation motifs produced in a layer of monocrystalline magnetic material which have three coplanar crystallographic axes of easy magnetization and forming an angle of 120° with one another, such motifs having a shape such that two cavities are bounded by two adjacent motifs and being aligned along an axis parallel with one of the crystallographic axes of such layer, and the bubbles are elongated from one of the cavities.

26. A method according to claims 22 or 23 wherein propagation motifs having two apexes are associated with each third means, and the bubbles are elongated from one of the apexes.

* * * * *